United States Patent
Lung et al.

(10) Patent No.: US 7,719,913 B2
(45) Date of Patent: May 18, 2010

(54) SENSING CIRCUIT FOR PCRAM APPLICATIONS

(75) Inventors: Hsiang-Lan Lung, Elmsford, NY (US); Mark Lamorey, South Burlington, VT (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 78 days.

(21) Appl. No.: 12/209,920

(22) Filed: Sep. 12, 2008

(65) Prior Publication Data

US 2010/0067285 A1    Mar. 18, 2010

(51) Int. Cl.
G11C 7/02 (2006.01)
G11C 11/00 (2006.01)

(52) U.S. Cl. .................. 365/208; 365/148; 365/163; 365/207

(58) Field of Classification Search .................. 365/208
See application file for complete search history.

(56) References Cited

U.S. PATENT DOCUMENTS

| | | | |
|---|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |

(Continued)

FOREIGN PATENT DOCUMENTS

WO    WO-0079539    12/2000

(Continued)

OTHER PUBLICATIONS

"Magnetic Bit Boost," www.sciencenews.org, Dec. 18 & 25, 2004, p. 389, vol. 166.

(Continued)

*Primary Examiner*—Son L Mai
(74) *Attorney, Agent, or Firm*—Haynes Beffel & Wolfeld LLP

(57) ABSTRACT

A sensing method for a memory cell as described herein includes selecting a memory cell. A first bias applied to the memory cell induces a first response in the memory cell. A second bias applied to the memory cell induces a second response in the memory cell, the second bias different from the first bias. The method includes determining a data value stored in the memory cell based on a difference between the first and second responses and a predetermined reference.

15 Claims, 7 Drawing Sheets

U.S. PATENT DOCUMENTS

| | | | |
|---|---|---|---|
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,805,563 B2 | 10/2004 | Ohashi et al. |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,085,154 B2 * | 8/2006 | Cho et al. ............... 365/163 |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,151,273 B2 | 12/2006 | Campbell et al. |

| | | | | | | |
|---|---|---|---|---|---|---|
| 7,154,774 | B2 | 12/2006 | Bedeschi et al. | 2006/0110888 A1 | 5/2006 | Cho et al. |
| 7,164,147 | B2 | 1/2007 | Lee et al. | 2006/0113520 A1 | 6/2006 | Yamamoto et al. |
| 7,166,533 | B2 | 1/2007 | Happ | 2006/0113521 A1 | 6/2006 | Lung |
| 7,169,635 | B2 | 1/2007 | Kozicki | 2006/0118913 A1 | 6/2006 | Yi et al. |
| 7,190,607 | B2 * | 3/2007 | Cho et al. ............... 365/148 | 2006/0124916 A1 | 6/2006 | Lung |
| 7,202,493 | B2 | 4/2007 | Lung et al. | 2006/0126395 A1 | 6/2006 | Chen et al. |
| 7,208,751 | B2 | 4/2007 | Ooishi et al. | 2006/0131555 A1 | 6/2006 | Liu et al. |
| 7,214,958 | B2 | 5/2007 | Happ | 2006/0138467 A1 | 6/2006 | Lung |
| 7,220,983 | B2 | 5/2007 | Lung | 2006/0154185 A1 | 7/2006 | Ho et al. |
| 7,229,883 | B2 | 6/2007 | Wang et al. | 2006/0157681 A1 | 7/2006 | Chen et al. |
| 7,238,959 | B2 | 7/2007 | Chen | 2006/0163554 A1 | 7/2006 | Lankhorst et al. |
| 7,238,994 | B2 | 7/2007 | Chen et al. | 2006/0175599 A1 | 8/2006 | Happ |
| 7,248,494 | B2 * | 7/2007 | Oh et al. ............... 365/148 | 2006/0198183 A1 | 9/2006 | Kawahara et al. |
| 7,251,157 | B2 | 7/2007 | Osada et al. | 2006/0205108 A1 | 9/2006 | Maimon et al. |
| 7,253,429 | B2 | 8/2007 | Klersy et al. | 2006/0211165 A1 | 9/2006 | Hwang et al. |
| 7,254,059 | B2 | 8/2007 | Li et al. | 2006/0226409 A1 | 10/2006 | Burr et al. |
| 7,269,052 | B2 | 9/2007 | Segal et al. | 2006/0234138 A1 | 10/2006 | Fehlhaber et al. |
| 7,277,317 | B2 | 10/2007 | Le Phan et al. | 2006/0237756 A1 | 10/2006 | Park et al. |
| 7,291,556 | B2 | 11/2007 | Choi et al. | 2006/0266993 A1 | 11/2006 | Suh et al. |
| 7,309,630 | B2 | 12/2007 | Fan et al. | 2006/0284157 A1 | 12/2006 | Chen et al. |
| 7,321,130 | B2 | 1/2008 | Lung et al. | 2006/0284158 A1 | 12/2006 | Lung et al. |
| 7,323,708 | B2 | 1/2008 | Lee et al. | 2006/0284214 A1 | 12/2006 | Chen |
| 7,332,370 | B2 | 2/2008 | Chang et al. | 2006/0284279 A1 | 12/2006 | Lung et al. |
| 7,336,526 | B2 | 2/2008 | Osada et al. | 2006/0286709 A1 | 12/2006 | Lung et al. |
| 7,351,648 | B2 | 4/2008 | Furukawa et al. | 2006/0286743 A1 | 12/2006 | Lung et al. |
| 7,359,231 | B2 | 4/2008 | Venkataraman et al. | 2006/0289848 A1 | 12/2006 | Dennison |
| 7,364,935 | B2 | 4/2008 | Lung et al. | 2007/0008786 A1 | 1/2007 | Scheuerlein |
| 7,365,385 | B2 | 4/2008 | Abbott | 2007/0030721 A1 | 2/2007 | Segal et al. |
| 7,379,328 | B2 | 5/2008 | Osada et al. | 2007/0037101 A1 | 2/2007 | Morioka |
| 7,385,235 | B2 | 6/2008 | Lung et al. | 2007/0096162 A1 | 5/2007 | Happ et al. |
| 7,394,088 | B2 | 7/2008 | Lung | 2007/0096248 A1 | 5/2007 | Philipp et al. |
| 7,397,060 | B2 | 7/2008 | Lung | 2007/0108077 A1 | 5/2007 | Lung et al. |
| 7,423,300 | B2 | 9/2008 | Lung et al. | 2007/0108429 A1 | 5/2007 | Lung |
| 7,426,134 | B2 | 9/2008 | Happ et al. | 2007/0108430 A1 | 5/2007 | Lung |
| 7,440,308 | B2 | 10/2008 | Jeong et al. | 2007/0108431 A1 | 5/2007 | Chen et al. |
| 7,449,710 | B2 | 11/2008 | Lung | 2007/0109836 A1 | 5/2007 | Lung |
| 7,479,649 | B2 | 1/2009 | Lung | 2007/0109843 A1 | 5/2007 | Lung et al. |
| 7,505,330 | B2 * | 3/2009 | Pawlowski et al. ...... 365/189.05 | 2007/0111429 A1 | 5/2007 | Lung |
| 2002/0024380 | A1 * | 2/2002 | Kono ................ 327/541 | 2007/0115794 A1 | 5/2007 | Lung |
| 2002/0070457 | A1 | 6/2002 | Sun et al. | 2007/0117315 A1 | 5/2007 | Lai et al. |
| 2002/0113273 | A1 | 8/2002 | Hwang et al. | 2007/0120104 A1 | 5/2007 | Ahn et al. |
| 2003/0072195 | A1 | 4/2003 | Mikolajick | 2007/0121363 A1 | 5/2007 | Lung |
| 2003/0095426 | A1 | 5/2003 | Hush et al. | 2007/0121374 A1 | 5/2007 | Lung et al. |
| 2003/0103400 | A1 * | 6/2003 | Van Tran .................. 365/207 | 2007/0126040 A1 | 6/2007 | Lung |
| 2003/0186481 | A1 | 10/2003 | Lung | 2007/0131922 A1 | 6/2007 | Lung |
| 2004/0026686 | A1 | 2/2004 | Lung | 2007/0138458 A1 | 6/2007 | Lung |
| 2004/0051094 | A1 | 3/2004 | Ooishi | 2007/0140029 A1 * | 6/2007 | Kim et al. ............... 365/210 |
| 2004/0113137 | A1 | 6/2004 | Lowrey | 2007/0147105 A1 | 6/2007 | Lung et al. |
| 2004/0165422 | A1 | 8/2004 | Hideki et al. | 2007/0153563 A1 | 7/2007 | Nirschl |
| 2004/0248339 | A1 | 12/2004 | Lung | 2007/0154847 A1 | 7/2007 | Chen et al. |
| 2004/0256610 | A1 | 12/2004 | Lung | 2007/0155172 A1 | 7/2007 | Lai et al. |
| 2005/0018526 | A1 | 1/2005 | Lee | 2007/0158632 A1 | 7/2007 | Ho |
| 2005/0029502 | A1 | 2/2005 | Hudgens | 2007/0158633 A1 | 7/2007 | Lai et al. |
| 2005/0062087 | A1 | 3/2005 | Chen et al. | 2007/0158645 A1 | 7/2007 | Lung |
| 2005/0093022 | A1 | 5/2005 | Lung | 2007/0158690 A1 | 7/2007 | Ho et al. |
| 2005/0127349 | A1 | 6/2005 | Horak et al. | 2007/0158862 A1 | 7/2007 | Lung |
| 2005/0145984 | A1 | 7/2005 | Chen et al. | 2007/0161186 A1 | 7/2007 | Ho |
| 2005/0167656 | A1 | 8/2005 | Sun et al. | 2007/0170881 A1 | 7/2007 | Noh et al. |
| 2005/0191804 | A1 | 9/2005 | Lai et al. | 2007/0173019 A1 | 7/2007 | Ho et al. |
| 2005/0201182 | A1 | 9/2005 | Osada et al. | 2007/0173063 A1 | 7/2007 | Lung |
| 2005/0212024 | A1 | 9/2005 | Happ | 2007/0176261 A1 | 8/2007 | Lung |
| 2005/0212026 | A1 | 9/2005 | Chung et al. | 2007/0187664 A1 | 8/2007 | Happ |
| 2005/0215009 | A1 | 9/2005 | Cho | 2007/0201267 A1 | 8/2007 | Happ et al. |
| 2005/0263829 | A1 | 12/2005 | Song et al. | 2007/0215852 A1 | 9/2007 | Lung |
| 2006/0006472 | A1 | 1/2006 | Jiang | 2007/0224726 A1 | 9/2007 | Chen et al. |
| 2006/0034112 | A1 * | 2/2006 | Oh et al. ............... 365/148 | 2007/0235811 A1 | 10/2007 | Furukawa et al. |
| 2006/0038221 | A1 | 2/2006 | Lee et al. | 2007/0236989 A1 | 10/2007 | Lung |
| 2006/0066156 | A1 | 3/2006 | Dong et al. | 2007/0246699 A1 | 10/2007 | Lung |
| 2006/0073642 | A1 | 4/2006 | Yeh et al. | 2007/0249090 A1 | 10/2007 | Philipp et al. |
| 2006/0091476 | A1 | 5/2006 | Pinnow et al. | 2007/0257300 A1 | 11/2007 | Ho et al. |
| 2006/0094154 | A1 | 5/2006 | Lung | 2007/0262388 A1 | 11/2007 | Ho et al. |
| 2006/0108667 | A1 | 5/2006 | Lung | 2007/0274121 A1 | 11/2007 | Lung et al. |
| 2006/0110878 | A1 | 5/2006 | Lung et al. | 2007/0285960 A1 | 12/2007 | Lung et al. |

| | | | |
|---|---|---|---|
| 2007/0298535 | A1 | 12/2007 | Lung |
| 2008/0006811 | A1 | 1/2008 | Philipp et al. |
| 2008/0012000 | A1 | 1/2008 | Harshfield |
| 2008/0014676 | A1 | 1/2008 | Lung et al. |
| 2008/0025089 | A1 | 1/2008 | Scheuerlein et al. |
| 2008/0043520 | A1 | 2/2008 | Chen |
| 2008/0094871 | A1 | 4/2008 | Parkinson |
| 2008/0101110 | A1 | 5/2008 | Happ et al. |
| 2008/0137400 | A1 | 6/2008 | Chen et al. |
| 2008/0164453 | A1 | 7/2008 | Breitwisch et al. |
| 2008/0165569 | A1 | 7/2008 | Chen et al. |
| 2008/0165570 | A1 | 7/2008 | Happ et al. |
| 2008/0165572 | A1 | 7/2008 | Lung |
| 2008/0166875 | A1 | 7/2008 | Lung |
| 2008/0179582 | A1 | 7/2008 | Burr et al. |
| 2008/0180990 | A1 | 7/2008 | Lung |
| 2008/0186755 | A1 | 8/2008 | Lung et al. |
| 2008/0191187 | A1 | 8/2008 | Lung et al. |
| 2008/0192534 | A1 | 8/2008 | Lung |
| 2008/0197334 | A1 | 8/2008 | Lung |
| 2008/0224119 | A1 | 9/2008 | Burr et al. |
| 2008/0225489 | A1 | 9/2008 | Cai et al. |
| 2008/0265234 | A1 | 10/2008 | Breitwisch et al. |
| 2009/0001341 | A1 | 1/2009 | Breitwisch et al. |
| 2009/0014704 | A1 | 1/2009 | Chen et al. |
| 2009/0023242 | A1 | 1/2009 | Lung |
| 2009/0027950 | A1 | 1/2009 | Lam et al. |
| 2009/0042335 | A1 | 2/2009 | Lung |
| 2009/0057641 | A1 | 3/2009 | Lung |
| 2009/0273968 | A1* | 11/2009 | Lamorey et al. ............ 365/163 |

FOREIGN PATENT DOCUMENTS

| | | |
|---|---|---|
| WO | WO-0145108 | 6/2001 |
| WO | WO-0225733 | 3/2002 |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, FI, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Bedeschi, F. et al., "4-MB MOSFET-Selected Phase-Change Memory Experimental Chip," IEEE, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, AN et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," 2003 Symposium on VLSI Technology Digest of Technical Papers, pp. 175-176.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., "OUM-A 180 nm Nonvolatile Memory Cell Element Technology for Stand Alone and Embedded Applications," IEEE IEDM 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al., "Novel u Trench Phase -Change Memory Cell for Embedded and Stand-Alone Non-Volatile Memory Applications," 2004 Symposium on VLSI Technology Digest of Technical Papers, pp. 18-19.
Pirovano, Agostino et al., "Reliability Study of Phase-Change Nonvolatile Memories," IEEE Transactions on Device and Materials Reliability, Sep. 2004, pp. 422-427, vol. 4, No. 3.
Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P. PDF#search='nonvolatile%20high%20density%20high%20performance%20phase%20change 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pp.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

US 7,719,913 B2

SENSING CIRCUIT FOR PCRAM APPLICATIONS

PARTIES TO A JOINT RESEARCH AGREEMENT

International Business Machines Corporation, a New York corporation, Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to read/sense circuitry for high density memory devices based on programmable resistive memory materials, including phase change materials like chalcogenide based materials and other materials, and to methods for operating such circuitry.

2. Description of Related Art

Programmable resistive memory materials such as phase change based memory materials, like chalcogenide based materials and similar materials, can be caused to change phase between an amorphous state and a crystalline state by application of electrical current at levels suitable for implementation in integrated circuits. The generally amorphous state is characterized by higher resistivity that the generally crystalline state, which can be sensed to indicate data. These properties have generated interest in using programmable resistive material to form nonvolatile memory circuits, which can be read and written with random access.

The change from the amorphous to the crystalline state, referred to as set or program herein, is generally a lower current operation in which current heats the material and causes transitions between the states. The change from a crystalline to a more highly amorphous state, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state.

In phase change memory, data is stored by causing transitions in an active region of the phase change material between amorphous and crystalline states. FIG. 1 is a graph of memory cells having one of two states, a low resistance set (programmed) state 100 and a high resistance reset (erased) state 102 each having non-overlapping resistance ranges.

The difference between the highest resistance $R_1$ of the low resistance set state 100 and the lowest resistance $R_2$ of the high resistance reset state 102 defines a read margin 101 used to distinguish cells in the set state 100 from those in the reset state 102. The data stored in a memory cell can be determined by determining whether the memory cell has a resistance corresponding to the low resistance state 100 or to the high resistance state 102, for example by measuring whether the resistance of the memory cell is above or below a threshold resistance value $R_{SA}$ 103 within the read margin 101. In order to reliably distinguish between the reset state 102 and the set state 100, it is important to maintain a relatively large read margin 101.

Prior art methods of determining resistance of the memory cell and thus the data value stored in the memory cell include comparing a voltage or current response of the memory cell to a reference. However, variations in materials, manufacturing processes, and also the operating environment lead to different programming characteristics including variations in the resistance of the memory material associated with each data value in an array of memory cells. These variations can make it difficult to accurately sense the resistive state of a memory cell by comparing the response of the memory cell to a reference, resulting in possible bit errors.

It is therefore desirable to provide sense circuitry supporting high-density devices which can accurately read the resistance state of a programmable resistive memory cell, and methods for operating such circuitry.

SUMMARY OF THE INVENTION

A sensing method for a memory cell as described herein includes selecting a memory cell. A first bias applied to the memory cell induces a first response in the memory cell. A second bias applied to the memory cell induces a second response in the memory cell, the second bias different from the first bias. The method includes determining a data value stored in the selected memory cell based on a difference between the first and second responses and a predetermined reference.

A memory device described herein includes a memory cell. The device includes circuitry to apply a first bias to the memory cell to induce a first response in the memory cell, and apply a second bias to the memory cell to induce a second response in the memory cell, the second bias different from the first bias. The device further includes sense amplifier circuitry responsive to a difference between the first and second responses and a predetermined reference to generate an output signal indicating a data value stored in the memory cell.

As described above, variations across an array can make it difficult to accurately sense the resistive state of a memory cell by comparing the response of the memory cell to a reference, resulting in possible bit errors. The present invention helps to solve this difficulty by a sensing method described herein which determines the data value stored based on a difference between the first and second responses and a predetermined reference.

Other aspects and advantages of the present invention can be seen on review of the drawings, the detailed description and the claims, which follow.

DETAILED DESCRIPTION

Figure 1:
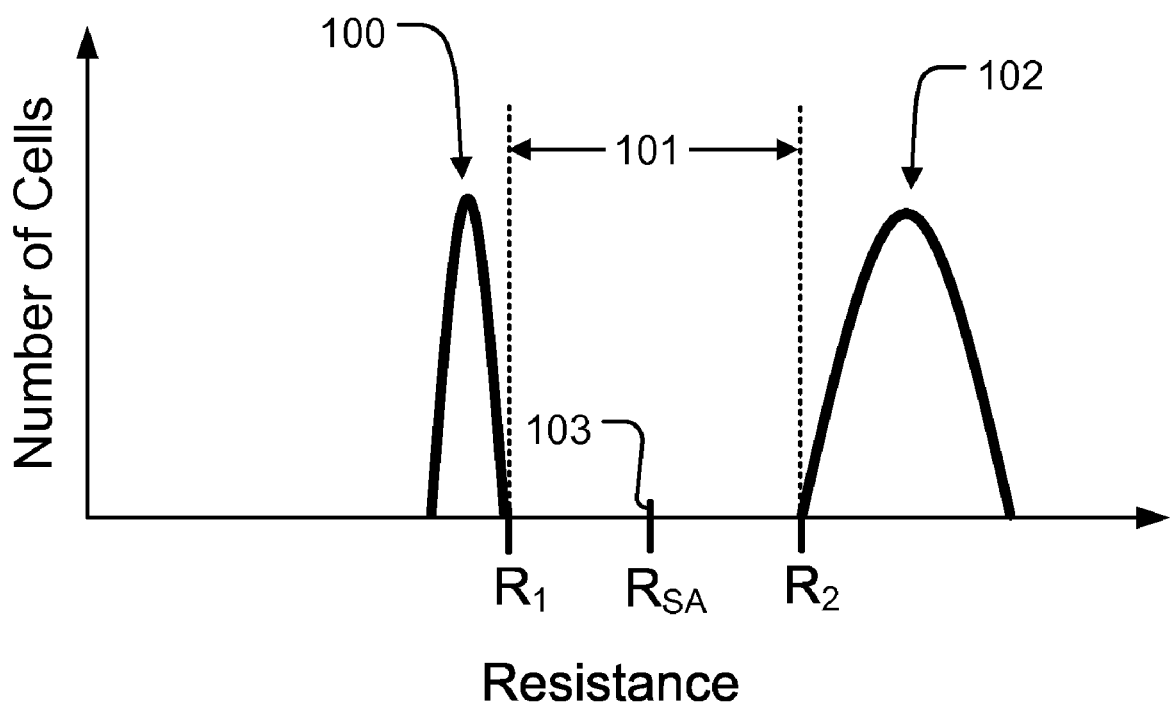
FIG. 1 is a graph of memory cells having one of two states, a low resistance set state and a high resistance reset state each having non-overlapping resistance ranges.

The following description of the invention will refer to specific structural embodiments and methods. It is understood that there is no intention to limit the invention to the specifically disclosed embodiments and methods but that the invention may be practiced using other features, elements, methods, and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

Figure 2:
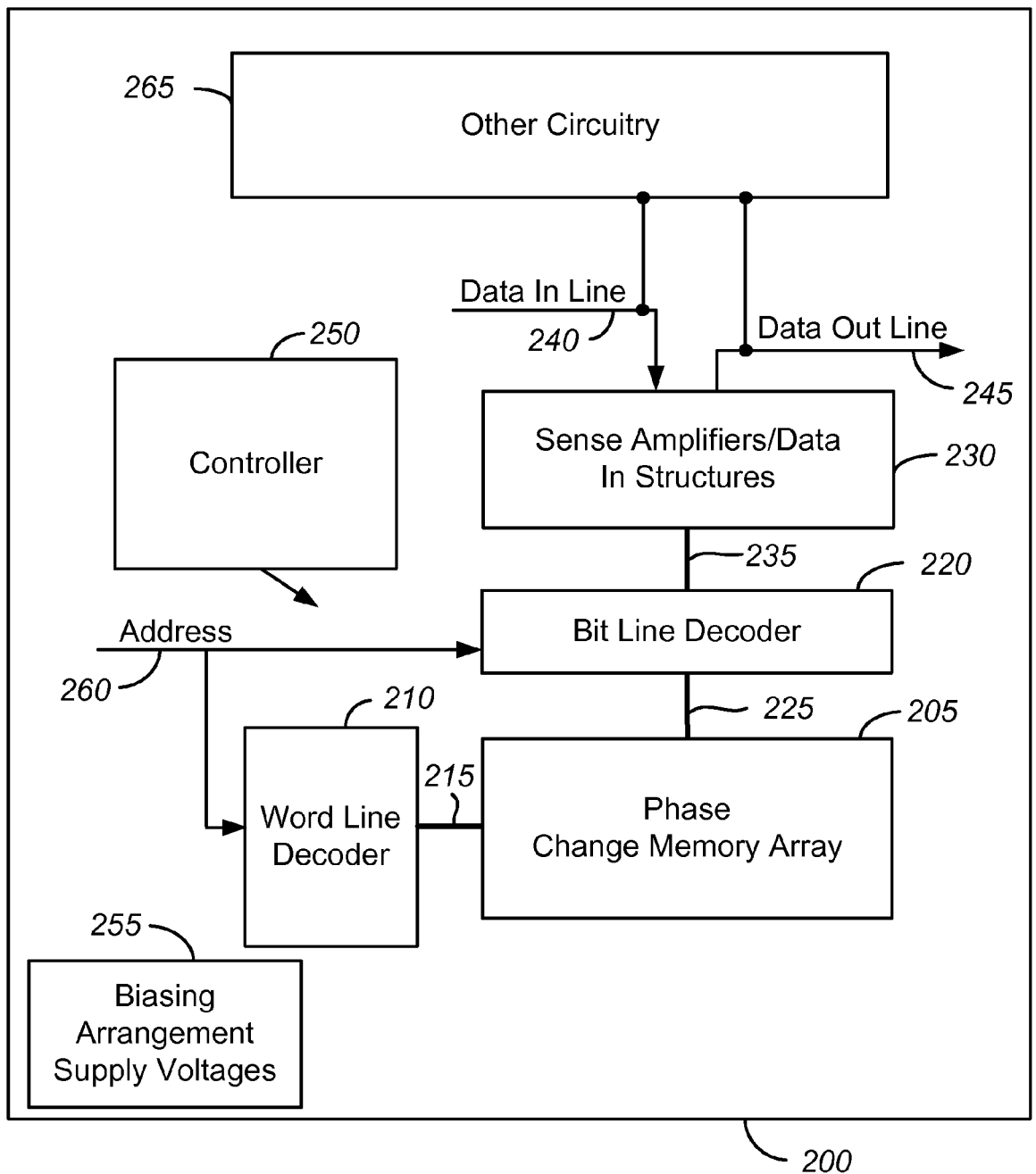
FIG. 2 is a simplified block diagram of an integrated circuit in which the present invention may be implemented.

FIG. 2 is a simplified block diagram of an integrated circuit 200 in which the present invention may be implemented. The integrated circuit 200 includes a memory array 205 implemented using memory cells (not shown) comprising programmable resistive memory material, discussed more fully below. A word line decoder 210 is in electrical communication with a plurality of word lines 215. A bit line decoder 220 is in electrical communication with a plurality of bit lines 225 to read data from, and write data to, the memory cells (not shown) in array 205. Addresses are supplied on bus 260 to word line decoder 210 and bit line decoder 220. Sense amplifiers and data-in structures in block 230 are coupled to bit line decoder 220 via data bus 235. Data is supplied via a data-in line 240 from input/output ports on integrated circuit 200, or from other data sources internal or external to integrated circuit 200, to data in structures in block 230. Other circuitry 265 may be included on the integrated circuit 200, such as general purpose processor or special purpose application circuitry, or a combination of modules providing system-on-a-chip functionality supported by array 205. Data is supplied via a data-out line 245 from the sense amplifiers in block 230 to input/output ports on integrated circuit 200, or other data destinations internal or external to integrated circuit 200.

A controller 250 implemented in this example using a bias arrangement state machine, controls the application of bias arrangement supply voltages 155, such as read, program, erase, erase verify and program verify voltages. Controller 250 may be implemented using special purpose logic circuitry as known in the art. In alternative embodiments, controller 250 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 250.

Figure 3:
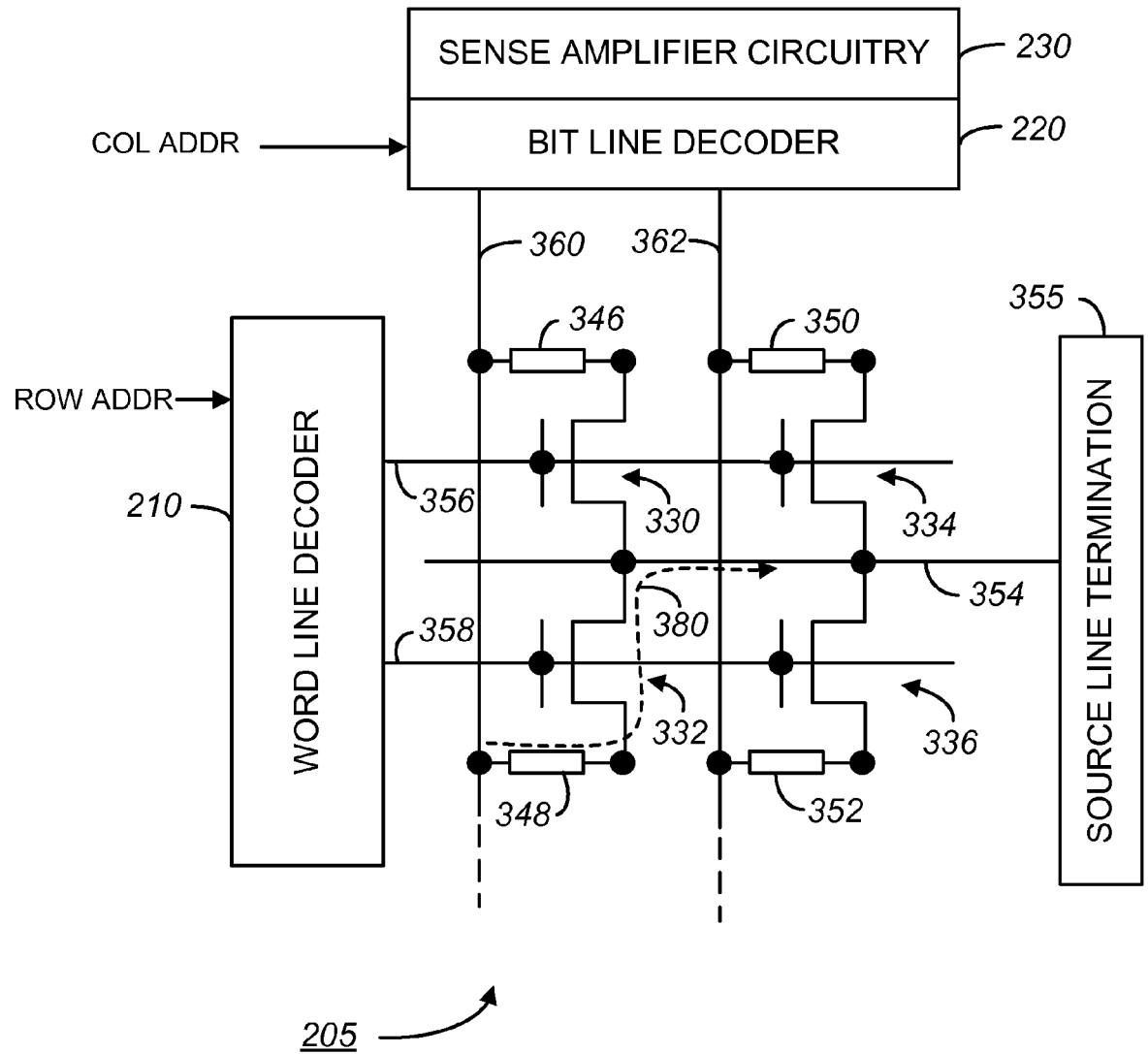
FIG. 3 illustrates a portion of memory cell array in which the present invention may be implemented.

As shown in FIG. 3, each of the memory cells of array 205 include an access transistor (or other access device such as a diode), four of which are shown as memory cells 330, 332, 334, and 336 and include respective memory elements 346, 348, 350, and 352. The portion of the array illustrated in FIG. 3 represents a small section of an array that can include millions of memory cells.

Sources of each of the access transistors of memory cells 330, 332, 334, and 336 are connected in common to source line 354 that terminates in a source line termination circuit 355, such as a ground terminal. In another embodiment the source lines of the access transistors are not electrically connected, but independently controllable. The source line termination circuit 355 may include bias circuits such as voltage sources and current sources, and decoding circuits for applying bias arrangements, other than ground, to the source line 254 in some embodiments.

A plurality of word lines 215 including word lines 356, 358 extend in parallel along a first direction. Word lines 356, 358 are in electrical communication with word line decoder 210. The gates of access transistors of memory cells 330, 334 are connected in common to word line 356, and the gates of access transistors of memory cells 332, 336 are connected in common to word line 358

A plurality of bit lines 225 including bit lines 360, 362 extend in parallel in a second direction. Memory elements 346, 348 couple the bit line 360 to the respective drains of the access transistors of memory cells 330, 332. Memory elements 350, 352 couple the bit line 362 to the respective drains of the access transistors of memory cells 334, 336.

Sense amplifier circuitry 230 may comprise a plurality of sense amplifiers (not directly shown), with each sense amplifier being connected to a corresponding bit line 360, 362 via the bit line decoder 220. Alternatively, the sense amplifier circuitry 230 may comprise a single sense amplifier and circuitry to selectively couple the sense amplifier to a corresponding bit line. Sense amplifier circuitry 230 is operable to detect the difference between a first current and a second current in a selected memory cell in response to a difference in voltage applied to the selected memory cell, the difference between the first current and the second current indicating the data value stored in the selected memory cell. Embodiments of sense amplifiers in sense amplifier circuitry are described in further detail below in conjunction with FIGS. 6 and 7.

It will be understood that the memory array 205 is not limited to the array configuration illustrated in FIG. 3, and other array configurations may be used. Additionally, instead of MOS transistors bipolar transistors or diodes may be used as access devices in some embodiments.

Embodiments of the memory cells include chalcogenide based phase change materials and other materials, for memory elements. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

The following are short summaries describing four types of resistive memory materials.

1. Chalcogenide Material $Ge_xSb_yTe_z$ x:y:z=2:2:5

Or other compositions with x: 0~5; y: 0~5; z: 0~10

GeSbTe with doping, such as N—, Si—, Ti—, or other element doping may also be used.

Formation method: By PVD sputtering or magnetron-sputtering method with reactive gases of Ar, $N_2$, and/or He, etc chalcogenide @ the pressure of 1 mtorr~100 mtorr. The deposition is usually done at room temperature. The collimator with aspect ratio of 1~5 can be used to improve the fill-in performance. To improve the fill-in performance, the DC bias of several ten to several hundred volts is also used. On the other hand, the combination of DC bias and the collimator can be used simultaneously.

The post deposition annealing treatment with vacuum or N2 ambient is sometimes needed to improve the crystallize state of chalcogenide material. The annealing temperature typically ranges 100 C to 400 C with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

2. CMR (Colossal Magneto Resistance) Material $Pr_xCa_yMnO_3$ x:y=0.5:0.5

Or other compositions with x: 0~1; y: 0~1

Another CMR material that includes Mn oxide may be used

Formation method: By PVD sputtering or magnetron-sputtering method with reactive gases of Ar, $N_2$, $O_2$, and/or He, etc. at the pressure of 1 mtorr~100 mtorr. The deposition temperature can range from room temperature to ~600 C, depending on the post deposition treatment condition. A collimator with an aspect ratio of 1~5 can be used to improve the fill-in performance. To improve the fill-in performance, the DC bias of several ten to several hundred volts is also used. On the other hand, the combination of DC bias and the collimator can be used simultaneously. A magnetic field of several ten gauss to 10,000 gauss may be applied to improve the magnetic crystallized phase.

The post deposition annealing treatment with vacuum or N2 ambient or $O_2/N_2$ mixed ambient may be needed to improve the crystallized state of CMR material. The annealing temperature typically ranges 400 C to 600 C with an anneal time of less than 2 hours.

The thickness of CMR material depends on the design of cell structure. The CMR thickness of 10 nm to 200 nm can be used to be the core material.

A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.

3. 2-element compound $Ni_xO_y$; $Ti_xO_y$; $Al_xO_y$; $W_xO_y$; $Zn_xO_y$; $Zr_xO_y$; $Cu_xO_y$; etc x:y=0.5:0.5

Other compositions with x: 0~1; y: 0~1

Formation Method:

1. Deposition: By PVD sputtering or magnetron-sputtering method with reactive gases of Ar, N2, O2, and/or He, etc. at the pressure of 1 mtorr~100 mtorr, using a target of metal oxide, such as NixOy; TixOy; AlxOy; WxOy; ZnxOy; ZrxOy; CuxOy; etc. The deposition is usually done at room temperature. A collimator with an aspect ratio of 1~5 can be used to improve the fill-in performance. To improve the fill-in performance, the DC bias of several ten to several hundred volts is also used. If desired, they combination of DC bias and the collimator can be used simultaneously.

The post deposition annealing treatment with vacuum or N2 ambient or O2/N2 mixed ambient as sometimes needed to improve the oxygen distribution of metal oxide. The annealing temperature ranges 400 C to 600 C with an anneal time of less than 2 hours.

2. Reactive deposition: By PVD sputtering or magnetron-sputtering method with reactive gases of Ar/O2, Ar/N2/O2, pure O2, He/O2, He/N2/O2 etc. at the pressure of 1 mtorr~100 mtorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several ten to several hundred volts is also used. If desired, the combination of DC bias and the collimator can be used simultaneously.

The post deposition annealing treatment with vacuum or N2 ambient or O2/N2 mixed ambient is sometimes needed to improve the oxygen distribution of metal oxide. The annealing temperature ranges 400 C to 600 C with an anneal time of less than 2 hours.

3. Oxidation: By a high temperature oxidation system, such as furnace or RTP system. The temperature ranges from 200 C to 700 C with pure O2 or N2/O2 mixed gas at a pressure of several mtorr to 1 atm. The time can range several minute to hours. Another oxidation method is plasma oxidation. An RF or a DC source plasma with pure O2 or Ar/O2 mixed gas or Ar/N2/O2 mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300 C, depending on the degree of plasma oxidation.

4. Polymer Material

TCNQ with doping of Cu, C60, Ag etc.

PCBM-TCNQ mixed polymer

Formation Method:

1. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200 C.

The post deposition annealing treatment with vacuum or N2 ambient is sometimes needed to improve the composition distribution of polymer material. The annealing temperature ranges room temperature to 300 C with an anneal time of less than 1 hour.

2. Spin-coat: By a spin-coater with the doped-TCNQ solution @ the rotation of less than 1000 rpm. After spin-coating, the wafer is put to wait the solid-state formation @ room temperature or temperature of less than 200 C. The waiting time ranges from several minutes to days, depending on the temperature and on the formation conditions.

Referring again to FIG. 3, in operation each of memory elements 346, 348, 350, 352 have a resistance range associated with a data value stored in the corresponding memory cell.

Reading or writing to a memory cell of array 205, therefore, can be achieved by applying a suitable voltage to one of word lines 358, 356 and coupling one of bit lines 360, 362 to a voltage source so that current flows through the selected memory element. For example, a current path 380 through a selected memory cell (in this example memory cell 332 and corresponding memory element 348 are selected) is established by applying voltages to the bit line 360, word line 358, and source line 354 sufficient to turn on the access transistor of memory cell 332 and induce current in path 380 to flow from the bit line 360 to the source line 354, or vice-versa. The level and duration of the voltages applied is dependent upon the operation performed, e.g. a reading operation or a writing operation.

In a reset (or erase) operation of memory cell 332 comprising phase change material, word line decoder 210 facilitates providing word line 358 with a suitable voltage pulse to turn on the access transistor of the memory cell 332. Bit line decoder 220 facilitates supplying a voltage pulse to bit line 360 of suitable amplitude and duration to induce a current to flow though memory element 348, the current raising the temperature of at least the active region above the transition temperature of the phase change material of the memory element 348 and also above the melting temperature to place at least the active region in a liquid state. The current is then terminated, for example by terminating the voltage pulses on the bit line 360 and on the word line 358, resulting in a relatively quick quenching time as the active region rapidly cools to stabilize to an amorphous phase. The reset operation can also comprise more than one pulse, for example using a pair of pulses.

In a set (or program) operation of the data stored in memory cell 332 comprising phase change material, word line decoder 210 facilitates providing word line 358 with a suitable voltage pulse to turn on the access transistor of the memory cell 332. Bit line decoder 220 facilitates supplying a voltage pulse to bit line 360 of suitable amplitude and duration to induce a current pulse sufficient to raise the temperature of a portion of the active region of the phase change material above the transition temperature and cause a transition of a portion of the active region from the amorphous phase into a crystalline phase, this transition lowering the resistance of the memory element 348 and setting the memory cell 332 to the desired state.

In a read (or sense) operation of the data stored in memory cell 332 comprising phase change material, word line decoder 210 facilitates providing word line 358 with a suitable voltage pulse to turn on the access transistor of the memory cell 332. Bit line decoder 220 facilitates supplying a voltage to bit line 360 of suitable amplitude and duration to induce current to flow in the memory element 348. The current on the bit line 360 and through the memory element 348 is dependent upon the resistance of, and therefore the data state associated with, the memory element 348 of the memory cell 332.

However, variations in materials, manufacturing processes, and also the operating environment will lead to variations in the resistance of memory elements across an array of memory cells storing a given data value. These variations will result in a distribution of current values associated with a given resistive state. Thus, if the current in a selected memory cell is compared to a reference current or voltage in another memory cell in the array or to a known reference resistance, the distribution of current values can make it difficult to accurately determine the resistive state, and therefore the data value, of the selected memory cell.

The present invention helps to solve this difficulty by a sensing method described herein which includes applying a first voltage pulse across a selected memory cell to induce a first current in the memory cell, and applying a second voltage pulse across the selected memory cell to induce a second current in the memory cell, the second voltage pulse different from the first voltage pulse. The data value stored in the selected memory cell is then determined based on a difference between the first and second currents.

Figure 4:
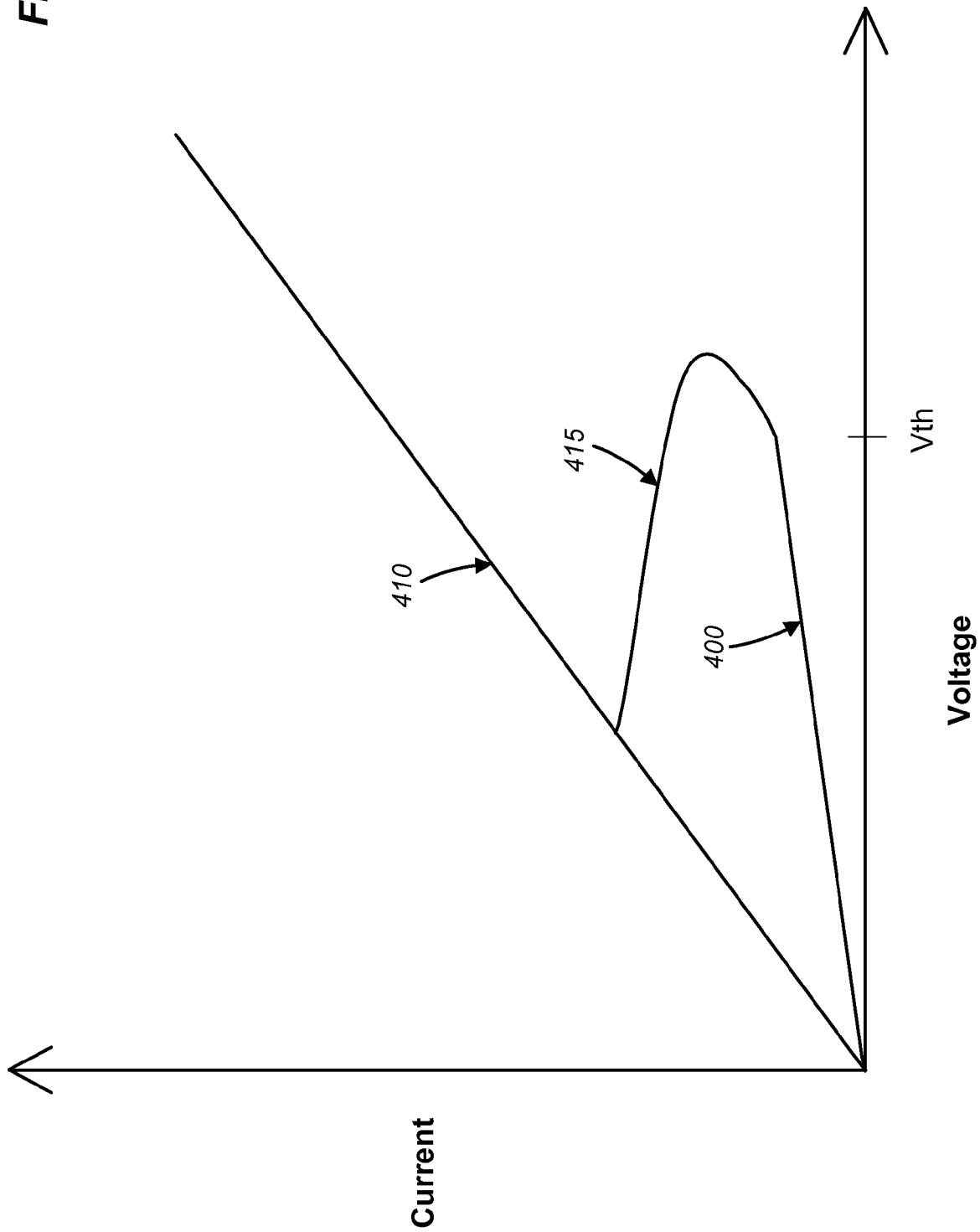
FIG. 4 illustrates example current-voltage (IV) curves for a phase change memory cell.

FIG. 4 illustrates example current-voltage (IV) curves for a phase change memory cell. In FIG. 4 curve 400 represents the behavior of the memory cell in the high resistance reset (erased) state and curve 410 represents the behavior of the memory cell in the low resistance set (programmed) state.

FIG. 4 also includes curve 415 representing the transition from the reset state 400 to the programmed state 410. As will be understood, the curve 415 is merely illustrative and the actual shape of the curve 415 depends upon the properties of the memory cell, the manner in which the voltage or current is applied to the memory cell, and the manner in which the phase change material heats up and cools down.

As shown in FIG. 4, a programming threshold $V_{th}$ represents the voltage at which the transition from the reset state 400 to the programmed state 410 begins. Because the memory cell undergoes a phase change as a result of heating of the phase change material of the memory element, it will be understood that the programming threshold $V_{th}$ is dependent upon the implementation of the memory cell including the memory cell structure, the thermal and electrical properties of the materials of the memory cell, and the pulse shape of the applied voltage or current.

Due to the difference in the resistance in the reset state 400 and the programmed state 410, a given difference in applied voltage across the memory cell will result in a greater difference in current if the memory cell is in the programmed state 410 than if the memory cell is in the reset state 400.

Figure 5:
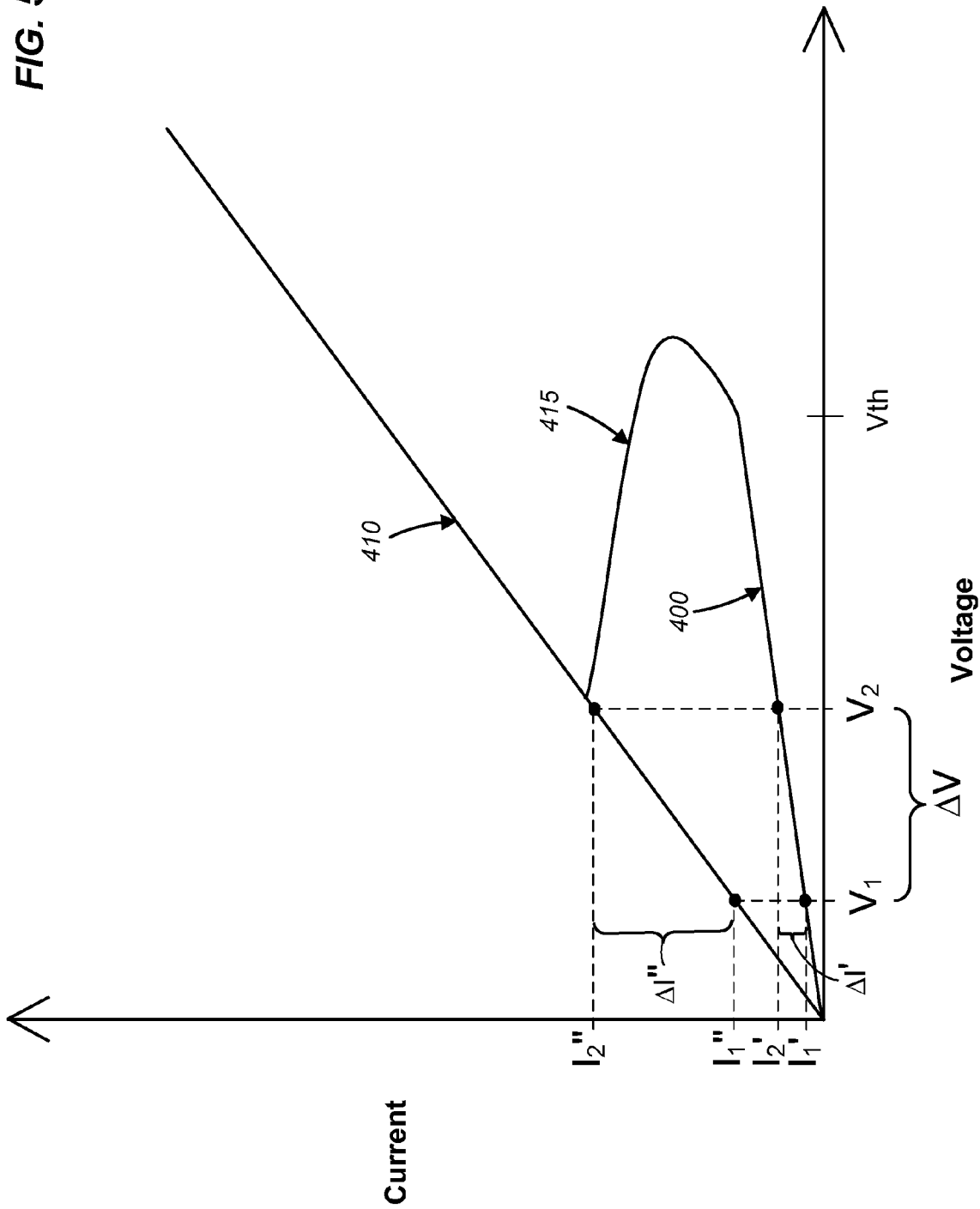
FIG. 5 illustrates the IV curve of FIG. 4 in which first and second voltages are applied to the memory cell.

FIG. 5 illustrates the IV curve of FIG. 4 in which first and second voltages are applied to the memory cell.

A first voltage $V_1$ applied across a selected memory cell induces a first current $I_1$ in the memory cell. As can be seen in FIG. 5, if the selected memory cell is in the reset state 400 the first current will be $I_1'$, while if the selected memory cell is in the programmed state 410 the first current will be $I_1''$. A second voltage $V_2$ different from the first voltage $V_1$ applied across the selected memory cell induces a second current $I_2$ in the memory cell. If the selected memory cell is in the reset state 400 the second current will be $I_2'$, while if the memory cell is in the programmed state 410 the second current will be $I_2''$.

Thus, for a given voltage difference $\Delta V = V_2 - V_1$ applied across the selected memory cell, the corresponding difference in current will be $\Delta I' = I_2' - I_1'$ if the memory cell is in the reset state 400, while the difference in current will be $\Delta I'' = I_2'' - I_1''$ if the memory cell is in the programmed state 410. Therefore, the resistive state of the selected memory cell can be determined based on whether the difference in current is $\Delta I''$ or $\Delta I'$.

Figure 6:
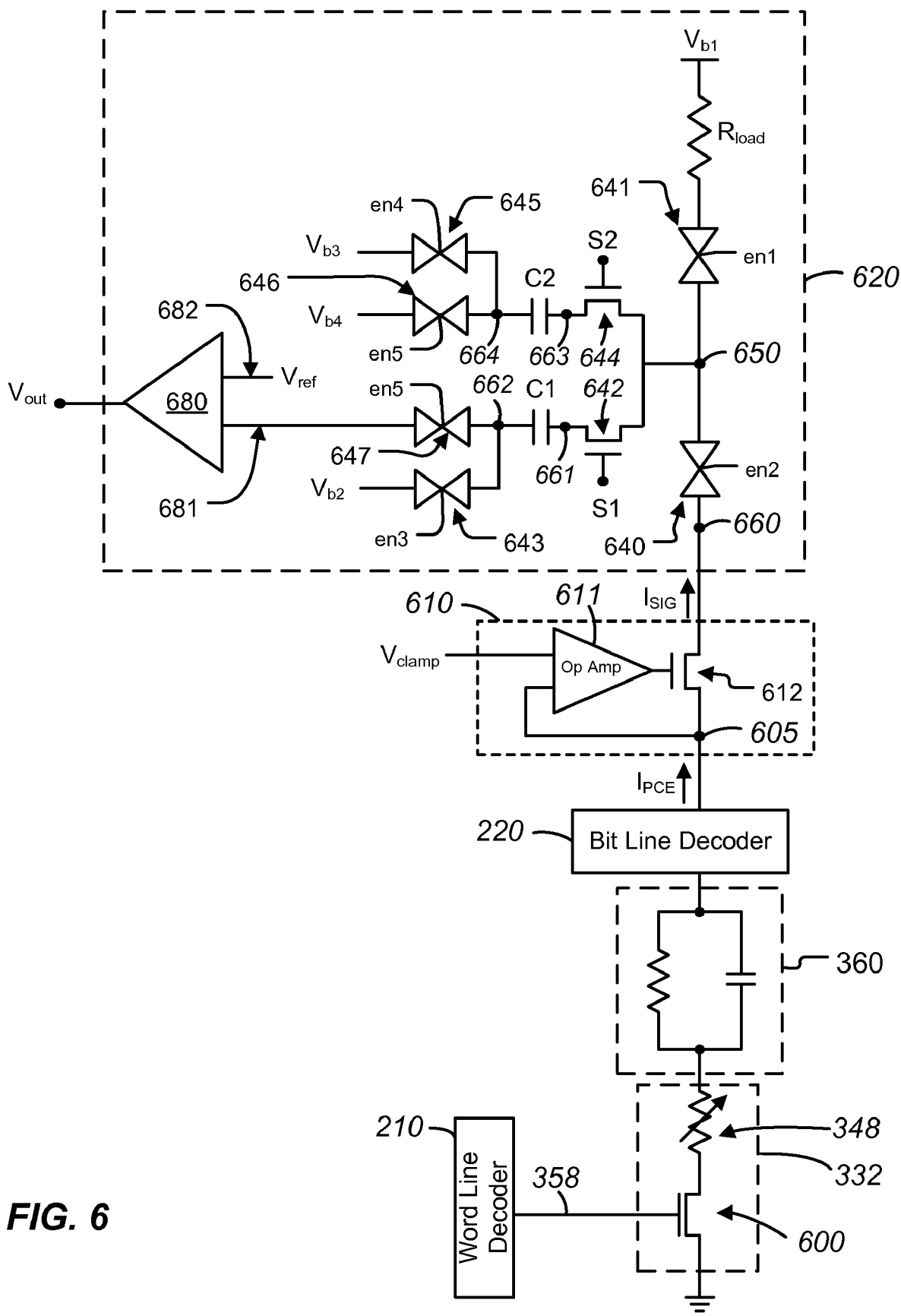
FIG. 6 is a simplified diagram of an architecture for which a sensing method of determining a data value stored in a selected memory cell as described herein can be implemented.

FIG. 6 is a simplified diagram of an architecture for which a sensing method described herein of determining a data value stored in a selected memory cell 332 based on a difference between first and second currents induced by first and second voltages applied across the selected memory cell 332 can be implemented.

In the simplified diagram of FIG. 6, memory cell 332 is modeled by access transistor 600 and a variable resistor for phase change element 348. Bit line 360 is modeled by a resistor/capacitor network as shown. The bit line decoder 220 is operable in response to address signals to couple the selected bit line 360 to node 605. The word line decoder 210 is operable in response to address signals to couple the selected word line 358 to a bias voltage (not shown) sufficient to turn on the access transistor 600.

Voltage clamping circuitry 610 is coupled to node 605 to provide a voltage (described in more detail with reference to FIG. 7 below) to the selected memory cell 332 to induce a current $I_{PCE}$ in the memory cell 332 during a sense (read) operation of the state of the memory cell 332 by sense amplifier circuitry 620. As will be described in more detail with reference to FIG. 7, the sense amplifier circuitry 620 determines a data value stored in the selected memory cell 332 based on a difference between currents in the selected memory cell 332 due to first and second voltages $V_1$ and $V_2$. The sense amplifier circuitry 620 also generates an output signal $V_{out}$ indicating the data value stored in the selected memory cell 332.

Figure 7:
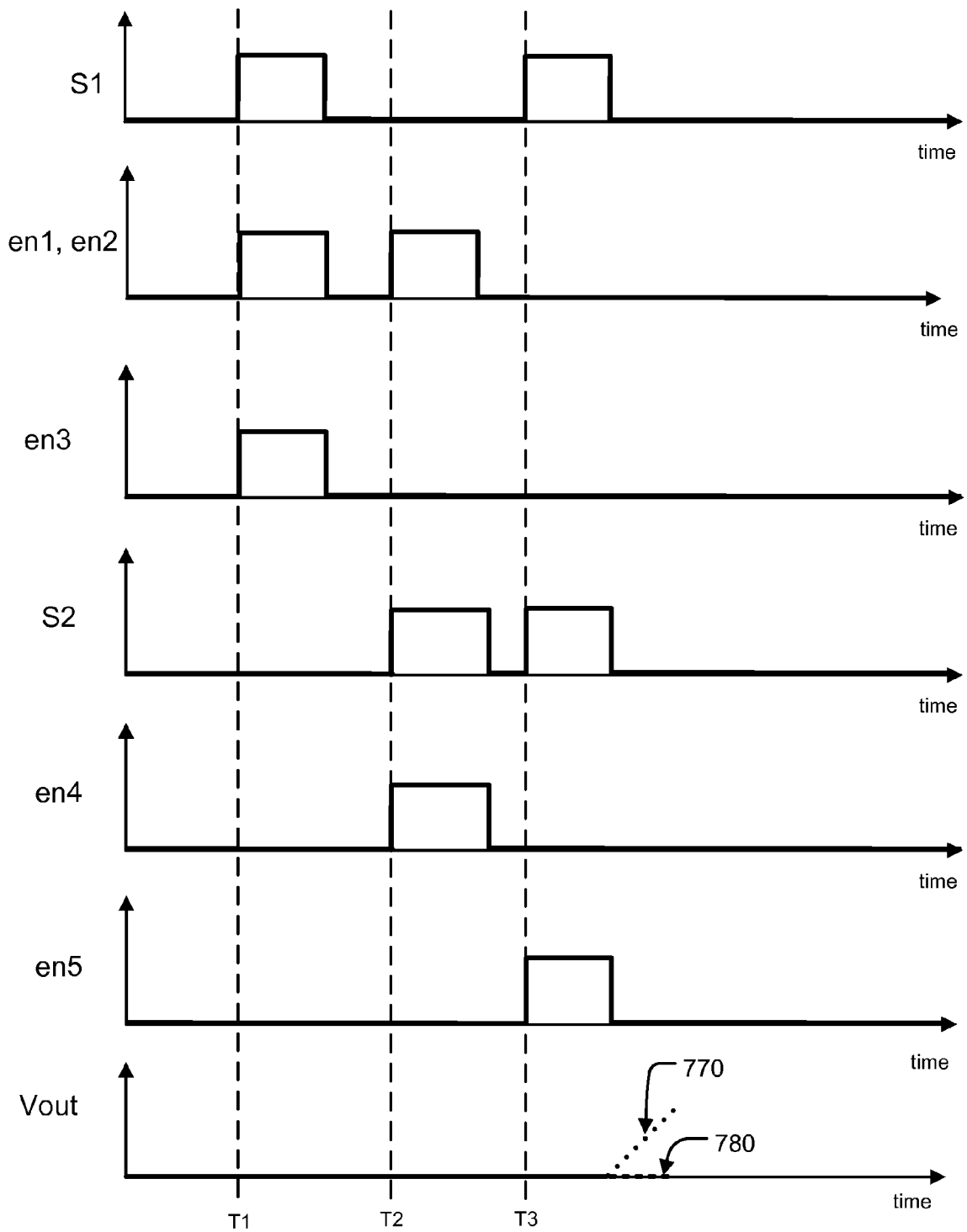
FIG. 7 is a timing diagram for operating the architecture of FIG. 6.

FIG. 7 is a timing diagram for operating the architecture of FIG. 6. It will be understood that the timing diagram of FIG. 7 is simplified and is not necessarily to scale.

Referring to FIGS. 6 and 7, at time $T_1$ a first current-voltage operational point of the selected memory cell 332 is determined. A bit line address signal is supplied to the bit line decoder 120 to couple the bit line 360 of the selected memory cell 332 to the node 605, a word line address signal is supplied to the word line 358 sufficient to turn on the access transistor 600, and voltage clamping circuitry 610 is responsive to a first clamping voltage $V_{clamp}$ to provide a first voltage $V_1$ to node 605, the first voltage $V_1$ inducing a current $I_{PCE}$ through the memory cell 332 dependent upon the resistance of the memory element 348. If the memory element 348 is in the high resistance reset state 400 the current $I_{PCE}$ through the memory cell 332 will be a current $I_1'$, while if the memory element 348 is in the low resistance set state 410 the current through the memory cell 332 will be a current $I_1''$.

Enable signal en2 turns on transmission gate 640 to couple node 660 to sensing node 650, enable signal en1 turns on transmission gate 641 to couple the series arrangement of a voltage $V_{bias1}$ and resistive load element $R_{load}$ to the sensing node 650, resulting in a current $I_{SIG}$ provided by the voltage clamping circuitry 610 to the sense amplifier circuitry 620. In the illustrated embodiment $R_{load}$ is shown as a resistor, although in some embodiments an active load such as a diode connected transistor can alternatively be used.

The magnitude of the current $I_{SIG}$ provided by the voltage clamping circuitry 610 is dependent upon the magnitude of the current $I_{PCE}$ and thus dependent upon the resistance of the memory element 348. In the illustrated embodiment the voltage clamping circuitry 610 includes operational amplifier 611 and transistor 612 such that the magnitudes of $I_{SIG}$ and $I_{PCE}$ are substantially equal, although it will be understood that the present invention is not limited as such. For example, in alternative embodiments the voltage clamping circuitry 610 may be implemented such that the magnitude of $I_{SIG}$ is a function of the magnitude of $I_{PCE}$, for example being directly or inversely proportional.

The current $I_{SIG}$ sets a voltage on the sensing node 650, signal S1 is set to a high state to turn on transistor 642 and couple a first node 661 of capacitor C1 to the sensing node 650, and enable signal en3 turns on transmission gate 643 to couple a voltage $V_{bias2}$ to a second node 662 of the capacitor C1 to provide an equalization path, thereby setting a voltage of the capacitor C1 between nodes 662 and 661 which depends upon the voltage of the sensing node 650. In the illustrated embodiment voltage $V_{bias2}$ is the substantially the same as $V_{bias1}$, although other bias voltages including ground may alternatively be used.

Since the voltage on the sensing node 650 depends upon the resistance of the memory element 348, the voltage across the capacitor C1 between nodes 662 and 661 will also depend upon the resistance of the memory element 348.

Next, at time $T_2$ a second current-voltage operational point of the selected memory cell 332 is determined. A bit line address signal is supplied to the bit line decoder 120 to couple the bit line 360 of the selected memory cell 332 to the node 605, a word line address signal is supplied to the word line 358 sufficient to turn on the access transistor 600, and voltage clamping circuitry 610 is responsive to a second clamping voltage $V_{clamp}$ to provide a second voltage $V_2$ to node 605, the second voltage $V_2$ inducing a current $I_{PCE}$ through the memory cell 332 dependent upon the resistance of the memory element 348. If the memory element 348 is in the high resistance reset state 400 the current $I_{PCE}$ through the memory cell 332 will be a current $I_2'$, while if the memory element 348 is in the low resistance set state 410 the current through the memory cell 332 will be a current $I_2''$.

Enable signal en2 turns on transmission gate 640 to couple node 660 to sensing node 650, enable signal en1 turns on transmission gate 641 to couple the series arrangement of voltage $V_{bias1}$ and resistive load element $R_{load}$ to the sensing node 650, resulting in a second current $I_{SIG}$ provided by the voltage clamping circuitry 610 to the sense amplifier circuitry 620.

The second current $I_{SIG}$ sets a voltage on the sensing node 650, signal S2 is set to a high state to turn on transistor 644 and couple a first node 663 of capacitor C2 to the sensing node 650, and enable signal en4 turns on transmission gate 645 to couple a voltage $V_{bias3}$ to a second node 664 of the capacitor C2 to provide an equalization path, thereby setting a voltage across the capacitor C2 between nodes 664 and 663 which depends upon the voltage of the sensing node 650. In the illustrated embodiment voltage $V_{bias3}$ is substantially equal to $V_{bias1}$, although other bias voltages including ground may alternatively be used.

As described above the voltage on the sensing node 650 during the determination of the first and second operational points of the memory cell 332 is dependent upon the current $I_{PCE}$ in the memory cell 332. Since the difference in resistance in the programmed state 410 and the reset state 400 results in a greater difference in current $I_{PCE}$ if the memory cell 332 is in the programmed state 410 (ΔI") than if the memory cell 332 is in the reset state 400 (ΔI'), this difference between ΔI" and ΔI' will result in a corresponding difference in the voltage of the sensing node 650 of the first and second operational points depending upon the resistance state of the memory cell 332. Therefore, the resulting difference in the voltage of the capacitor C1 between nodes 662 and 661 and the voltage of the capacitor C2 between nodes 664 and 663 can be sensed to indicate the data value stored in the selected memory cell 332.

At time $T_3$ signal S1 and signal S2 are set to a high state to couple node 661 of capacitor C1 to node 663 of capacitor C2, enable signal en5 turns on transmission gate 646 to couple node 664 of capacitor C2 to a reference voltage $V_{bias4}$, and enable signal en5 turns on transmission gate 647 to couple node 662 to a first input 681 of a sense amplifier 680. $V_{bias4}$ is a predetermined voltage, and may in some embodiments be a ground.

As described above the difference in the voltage of the capacitor C1 between nodes 662 and 661 and the voltage of the capacitor C2 between nodes 664 and 663 is dependent upon the resistance of the memory element 348. Therefore, the resulting difference in the voltage between the first input 681 and the bias voltage $V_{bias4}$ is a subtraction of the voltages of the first and second capacitors C1, C2 and indicates the resistive state of the selected memory cell 332. Therefore, the voltage on the first input 681 can be sensed to indicate the resistive state of the memory element 348.

The sense amplifier 680 is responsive to the difference between the voltage on the first input 681 and a predetermined reference voltage $V_{ref}$ on a second input and generates an output signal $V_{OUT}$ indicating the resistive state of the memory element 348. In FIG. 7 $V_{out}$ is a first voltage along curve 770 if the memory cell 332 is in the programmed state, and is a second voltage along curve 780 if the memory cell 332 is in the reset state.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A sensing method for a memory cell, the method comprising:
    selecting a memory cell;
    applying a first bias to the memory cell to induce a first response in the memory cell;
    applying a second bias to the memory cell to induce a second response in the memory cell, the second bias different from the first bias; and
    determining a data value stored in the memory cell based on a difference between the first and second responses and a predetermined reference.

2. The method of claim 1, wherein:
    the applying a first bias comprises applying a first voltage to the memory cell to induce a first current in the memory cell;
    the applying a second bias comprises applying a second voltage to the memory cell to induce a second current in the memory cell, the second voltage different from the first voltage; and
    the determining a data value stored in the memory cell comprises determining the data value based on a difference between the first and second currents and the predetermined reference.

3. The method of claim 2, wherein the determining a data value in the memory cell further comprises:
    setting a sensing node to a first sensing voltage based on the first current in the memory cell; and
    setting the sensing node to a second sensing voltage based on the second current in the memory cell.

4. The method of claim 3, wherein:
    the setting a sensing node to a first sensing voltage comprises electrically coupling a series arrangement of a third voltage and a resistive load element to the sensing node, and proving a third current through the series arrangement dependent upon the first current in the memory cell; and
    the setting a sensing node to a second sensing voltage comprises electrically coupling the series arrangement of the third voltage and the resistive load element to the sensing node, and providing a fourth current through the series arrangement dependent upon the second current in the memory cell.

5. The method of claim 4, wherein:
    the third current is proportional to the first current; and
    the fourth current is proportional to the second current.

6. The method of claim 3, wherein the determining a data value in the memory cell further comprises:
    setting a voltage across a first capacitor dependent upon the first sensing voltage;
    setting a voltage across a second capacitor dependent upon the second sensing voltage;
    coupling a voltage to a first input of a sense amplifier based on a difference between the voltage across the first capacitor and the voltage across the second capacitor; and
    generating an output signal of the sense amplifier based on a difference between the voltage of the first input of the sense amplifier and a predetermined reference voltage applied to a second input of the sense amplifier, the output signal indicating the data value stored in the memory cell.

7. The method of claim 6, wherein the output signal of the sense amplifier comprises a first output voltage if the memory cell is in a programmed state, and comprises a second output voltage if the memory cell is in a reset state, the first output voltage different from the second output voltage.

8. The method of claim 6, wherein:
    the setting a voltage across a first capacitor comprises electrically coupling a first node of the first capacitor to the sensing node when the voltage on the sensing node is the first sensing voltage, and electrically coupling a second node of the first capacitor to a fourth voltage;
    the setting a voltage across the second capacitor comprises electrically coupling a first node of the second capacitor to the sensing node when the voltage on the sensing node is the second sensing voltage, and electrically coupling a second node of the second capacitor to a fifth voltage; and the coupling a voltage to a first input of a sense amplifier comprises:
  electrically coupling the first node of the first capacitor to the first node of the second capacitor;
  electrically coupling the second node of the second capacitor to a sixth voltage; and
  electrically coupling the second node of the first capacitor to the first input of the sense amplifier.

9. A method of claim 1, wherein the memory cell comprises programmable resistive memory material.

10. A memory device comprising:
  a memory cell;
  circuitry to apply a first bias to the memory cell to induce a first response in the memory cell, and apply a second bias to the memory cell to induce a second response in the memory cell, the second bias different from the first bias; and
  sense amplifier circuitry responsive to a difference between the first and second responses and a predetermined reference to generate an output signal indicating a data value stored in the memory cell.

11. The device of claim 10, wherein:
  the first bias comprises a first voltage applied to the memory cell to induce a first current in the memory cell;
  the second bias comprises a second voltage applied to the memory cell to induce a second current in the memory cell; and
  the sense amplifier circuitry responsive to a difference between the first and second currents and the predetermined reference to generate an output signal indicating the data value stored in the memory cell.

12. The device of claim 11, wherein the sense amplifier circuitry comprises a sensing node and a series arrangement of a third voltage and a resistive load element selectively coupled to the sensing node, and further comprising:
  circuitry to provide a third current through the series arrangement dependent upon the first current in the memory cell to set the sensing node to a first sensing voltage, and to provide a fourth current through the series arrangement dependent upon the second current in the memory cell to set the sensing node to a second sensing voltage.

13. The device of claim 12, wherein the sense amplifier circuitry further comprises first and second capacitors, the sense amplifier circuitry adapted to set a voltage across the first capacitor dependent upon the first sensing voltage and set a voltage across the second capacitor dependent upon the second sensing voltage, and responsive to a difference between the voltages across the first and second capacitors to generate an output signal indicating the data value stored in the memory cell.

14. The device of claim 13, wherein the output signal of the sense amplifier circuitry comprises a first output voltage if the memory cell is in a programmed state, and comprises a second output voltage if the memory cell is in a reset state, the first output voltage different from the second output voltage.

15. The device of claim 10, wherein the memory cell comprises programmable resistive memory material.

* * * * *